(12) United States Patent
van Quach et al.

(10) Patent No.: US 7,224,249 B2
(45) Date of Patent: May 29, 2007

(54) STRIPLINE STRUCTURE WITH MULTIPLE GROUND VIAS SEPARATED BY NO MORE THAN 100 MIL

(75) Inventors: Minh van Quach, Fort Collins, CO (US); T. Shannon Sawyer, Fort Collins, CO (US); William Scott Burton, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/222,268

(22) Filed: Sep. 8, 2005

(65) Prior Publication Data

US 2007/0052503 A1  Mar. 8, 2007

(51) Int. Cl.
*H01P 3/08* (2006.01)
(52) U.S. Cl. ...................... 333/238; 333/246
(58) Field of Classification Search ............... 333/238, 333/246
See application file for complete search history.

(56) References Cited

U.S. PATENT DOCUMENTS 2,812,501 A * 11/1957 Sommers ................. 333/238
4,513,266 A *  4/1985 Ishihara ................... 333/238
6,072,375 A *  6/2000 Adkins et al. ............... 333/1

* cited by examiner

*Primary Examiner*—Benny Lee

(57) ABSTRACT

A stripline structure. The stripline structure includes a stripline transmission line, a first ground plane, a first dielectric layer overlaying the first ground plane, a conductive trace overlaying the first dielectric layer, a second dielectric layer overlaying the conductive trace, a second ground plane overlaying the second dielectric layer, multiple first conductive vias, and multiple second conductive vias. Each first conductive via and each second conductive via electrically connects the first ground plane to the second ground plane. The multiple first conductive vias are located along a first line parallel to the conductive trace, and the multiple second conductive vias are located along a second line parallel to the conductive trace. The first line and the second line are located on opposite sides of the conductive trace.

11 Claims, 3 Drawing Sheets

STRIPLINE STRUCTURE WITH MULTIPLE GROUND VIAS SEPARATED BY NO MORE THAN 100 MIL

BACKGROUND

When components in high frequency circuits are separated by relatively large distances as compared with the frequency at which the circuit is to be used, signals are typically transferred between such components by means of transmission lines of one kind or another. Two such transmission lines that are often used in modern high frequency microcircuits on patterned printed circuit boards and in hybrid circuits are the microstrip transmission line and the stripline transmission line. A microstrip transmission line is formed by separating a metal conductive strip from a parallel conductive ground plane by means of a dielectric layer. A stripline transmission line is constructed similar to that of a microstrip transmission line but has two conductive ground planes, one on each side of the metal conductive strip. The conductive ground planes are separated from the metal conductive strip by dielectrics.

Designing and fabricating microstrip transmission lines and stripline transmission lines for minimum signal loss is of great importance for these devices. In some cases a layer of gold has been included on the metal conductive layer and the ground plane(s) to reduce resistive losses. Also, low loss dielectrics are often used to reduce leakage currents between the metal conductive layer and the ground plane(s).

A loss mechanism which has been found to exist in stripline transmission lines and which can result in a substantial loss of signal strength is caused by the excitation of parallel plate mode signals. The parallel plate mode occurs between the two ground planes in stripline transmission lines when one of the ground planes is capable of attaining a potential which differs from that of the other ground plane.

SUMMARY

In representative embodiments, a stripline structure is disclosed. The stripline structure includes a stripline transmission line, a first ground plane, a first dielectric layer overlaying the first ground plane, a conductive trace overlaying the first dielectric layer, a second dielectric layer overlaying the conductive trace, a second ground plane overlaying the second dielectric layer, multiple first conductive vias, and multiple second conductive vias. Each first conductive via and each second conductive via electrically connects the first ground plane to the second ground plane. The multiple first conductive vias are located along a first line parallel to the conductive trace, and the multiple second conductive vias are located along a second line parallel to the conductive trace. The first line and the second line are located on opposite sides of the conductive trace.

Other aspects and advantages of the representative embodiments presented herein will become apparent from the following detailed description, taken in conjunction with the accompanying drawings.

BRIEF DESCRIPTION OF THE DRAWINGS

The accompanying drawings provide visual representations which will be used to more fully describe various representative embodiments and can be used by those skilled in the art to better understand them and their inherent advantages. In these drawings, like reference numerals identify corresponding elements.

DETAILED DESCRIPTION

Figure 1:
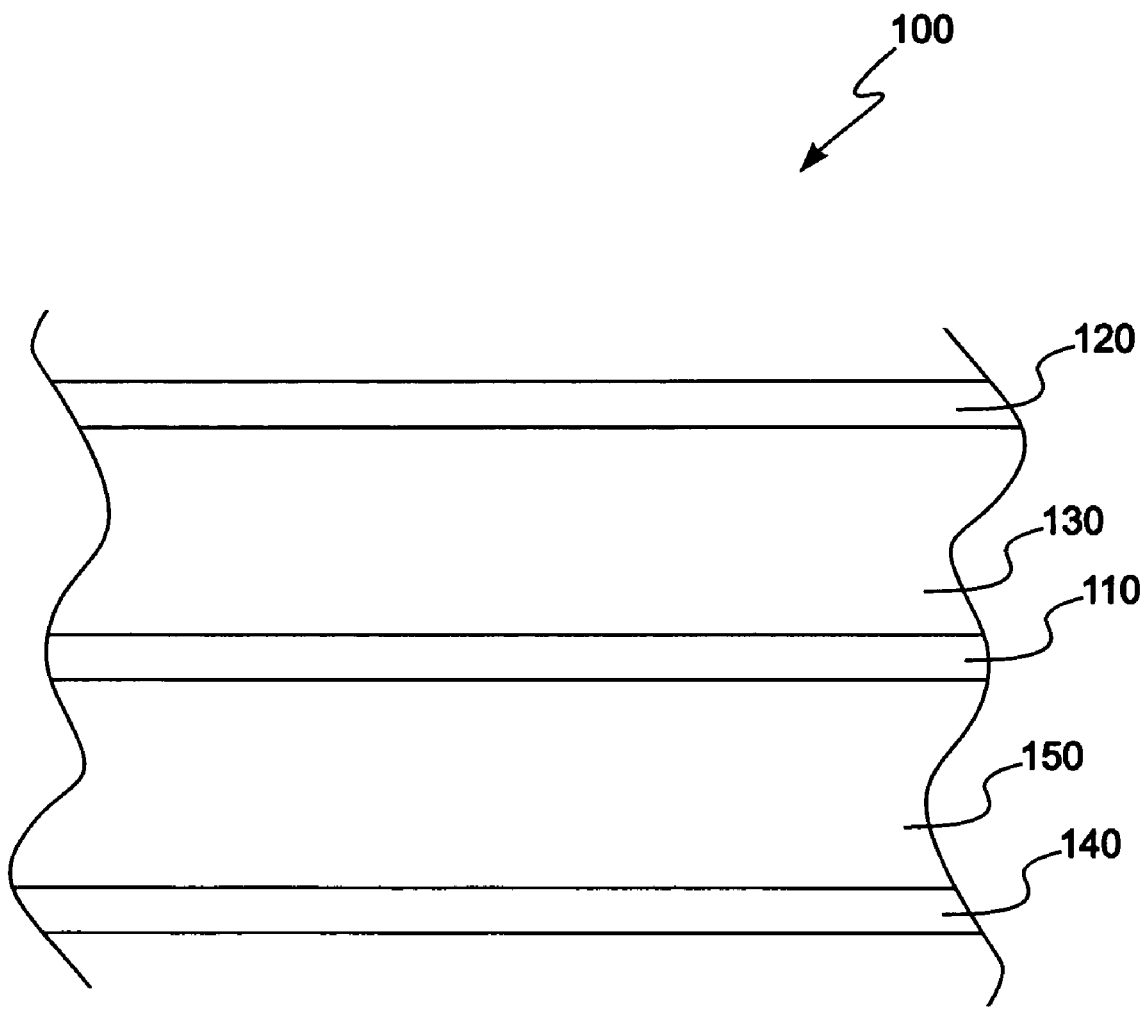
FIG. 1 is a drawing of a side view of a stripline transmission line.

As shown in the drawings for purposes of illustration, the present patent document discloses novel techniques for the suppression of excitation of parallel plate mode signals in printed circuit board and hybrid circuits.

In the following detailed description and in the several figures of the drawings, like elements are identified with like reference numerals.

FIG. 1 is a drawing of a side view of a stripline transmission line 100. In the stripline transmission line 100 of FIG. 1, a conductive trace 110 is separated from a first ground plane 120 by a first dielectric layer 130. The conductive trace 110 is also separated from a second ground plane 140 by a second dielectric layer 150. The second ground plane 140 and the second dielectric layer 150 are located on the opposite side of the conductive trace 110 from the first ground plane 120 and the first dielectric layer 130.

Figure 2:
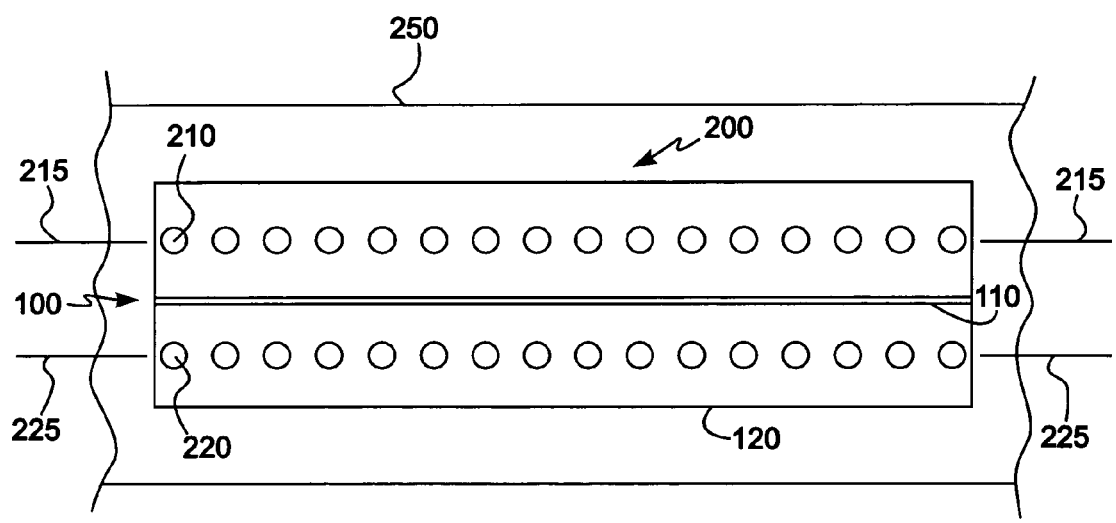
FIG. 2 is a drawing of a top view of a stripline structure as described in various representative embodiments.

FIG. 2 is a drawing of a top view of a stripline structure 200 as described in various representative embodiments. In FIG. 2, the stripline structure 200 comprises the stripline transmission line 100, multiple first conductive vias 210, and multiple second conductive vias 220. The multiple first conductive vias 210 are located along a first line 215 parallel to the conductive trace 110, and the multiple second conductive vias 220 are located along a second line 225 parallel to the conductive trace 110. The first conductive vias 210 located along the first line 215 are located on opposite sides of the conductive trace 110 from the second conductive vias 220 located along the second line 225. Each of the first conductive vias 210 electrically connects the first ground plane 120 to the second ground plane 140, and each of the second conductive vias 220 electrically connects the first ground plane 120 to the second ground plane 140. The second ground plane 140 is located below the first ground plane 120 and is not shown in FIG. 2.

The stripline structure 200 shown in FIG. 2 is fabricated on a circuit interconnect structure 250 which could be, for example, a printed circuit board 250, a hybrid circuit structure 250, or other appropriate structure. The first and the second conductive vias 210, 220 could be 40 mils diameter plated thru-holes repeated along the length of the stripline transmission line 100 on 70 mil centers and could be constructed using standard printed circuit board construction techniques, hybrid circuit construction techniques, or other appropriate construction techniques. The first conductive vias 210 and the second conductive vias 220 are each located 50 mils from the edge of conductive via 210, 220 to the edge of conductive trace 110 with the conductive trace 110 being 10 mils in width. The conductive vias 210,220 could also be created by means of laser drilling or other appropriate technology. The conductive vias 210, 220 could also have conductive material deposited in them by various means including electrolesss copper deposition and the application of conductive pastes. Conductive paths could also be obtained by soldering or forced fitting conductive posts in the vias 210, 220.

Figure 3:
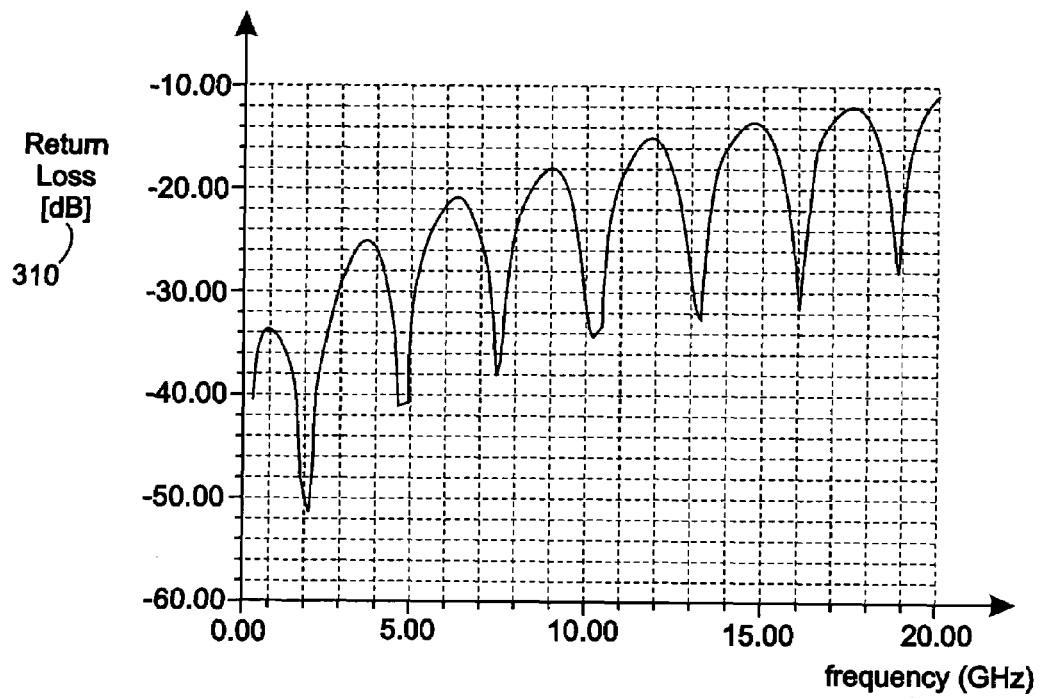
FIG. 3 is a plot of return loss vs. frequency for the stripline structure of FIG. 2.

FIG. 3 is a plot of return loss 310 vs. frequency 320 for the stripline structure 200 of FIG. 2. Note that below 20 GHz, return loss 310 is less than =10 dB for an example stripline transmission line 100 having a length of 1100 mils. Without the first and second conductive vias 210,220 of FIG. 2, the return loss 310 would have been as high as −4 dB for an example stripline transmission line 100 having the same length of 1100 mils.

Figure 4:
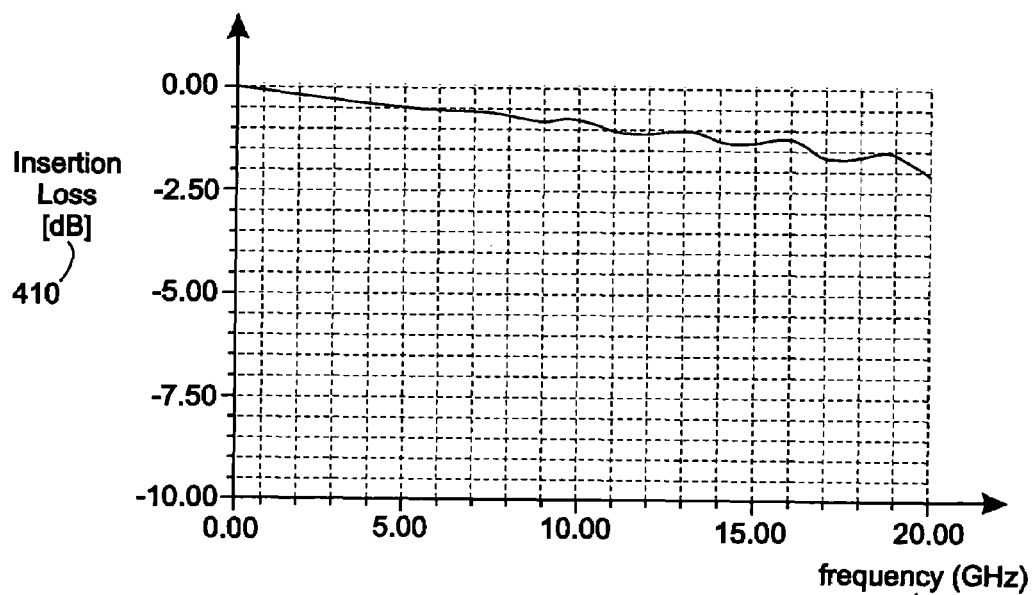
FIG. 4 is a plot of insertion loss vs. frequency for the stripline structure of FIG. 2.

FIG. 4 is a plot of insertion loss 410 vs. frequency 320 for the stripline structure 200 of FIG. 2. Note that below 20 GHz, insertion loss 410 is less than −2 dB for an example stripline transmission line 100 having a length of 1100 mils. Without the first and second conductive vias 210, 220 of FIG. 2, the insertion loss 410 would have been as high as −12 dB for an example stripline transmission line 100 having the same length of 1100 mils.

In representative embodiments, the stripline structure 200 comprises at least three first conductive vias 210 and at least three second conductive vias 220. In other representative embodiments, the multiple first conductive vias 210 are separated from each other by no more than 60 mils, and the multiple second conductive vias 220 are separated from each other by no more than 60 mils. And in still other representative embodiments, the multiple first conductive vias 210 are separated from the conductive trace 110 by no more than 100 mils, and the multiple second conductive vias 220 are separated from the conductive trace 110 by no more than 100 mils.

In representative embodiments, stripline structures 200 are disclosed which are capable of reducing the excitation of parallel plating mode radiation resulting in less than −2 dB insertion loss up to 20 GHz and less than −10 dB return loss also up to 20 GHz. As such, the bandwidth of a stripline transmission line can be increased with minimal additional cost. The stripline transmission lines 100 of the stripline structures 200 can have cable connectors such as SMA or SMP or probing pads on the inputs and outputs for coupling test instruments and/or can be connected internal to the circuit interconnect structure 250 to devices, such as packaged integrated circuits or other appropriate devices, attached to the circuit interconnect structure 250.

The first and second conductive vias 210, 220 connect the parallel first and second ground planes 120, 140 together so as to reduce the excitation of parallel plating mode radiation. The spacing between the conductive trace 110 and the first and second conductive vias 210, 220 can be selected to provide an acceptable trade-off between manufacturability and stripline transmission line 100 performance. Also, the spacing between the first conductive vias 210, as well as the spacing between the second conductive vias 220, can be selected to provide an acceptable trade-off between manufacturability and stripline transmission line 100 performance.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A stripline structure, comprising:
    a stripline transmission line, comprising:
        a first ground plane,
        a first dielectric layer overlaying the first ground plane,
        a conductive trace overlaying the first dielectric layer,
        a second dielectric layer overlaying the conductive trace, and
        a second ground plane overlaying the second dielectric layer,
    multiple first conductive vias, wherein each first conductive via electrically connects the first ground plane to the second ground plane, wherein the multiple first conductive vias are located along a first line parallel to the conductive trace, and wherein the multiple first conductive vias are separated from each other by no more than 100 mils; and
    multiple second conductive vias, wherein each second conductive via electrically connects the first ground plane to the second ground plane, wherein the multiple second conductive vias are located along a second line parallel to the conductive trace, wherein the first line and the second line are located on opposite sides of the conductive trace, and wherein the multiple second conductive vias are separated from each other by no more than 100 mils.

2. The stripline structure as recited in claim 1, wherein the stripline structure is constructed as a part of a circuit interconnect structure selected from the group consisting of printed circuit boards and hybrid circuit structures.

3. The stripline structure as recited in claim 1, wherein the multiple first conductive vias and the multiple second conductive vias are selected from the group consisting of plated thru-holes and laser drilled vias.

4. The stripline structure as recited in claim 1, wherein the multiple first conductive vias comprise at least three first conductive vias and the multiple second conductive vias comprise at least three second conductive vias.

5. The stripline structure as recited in claim 1, wherein the multiple first conductive vias are separated from each other by no more than 60 mils and wherein the multiple second conductive vias are separated from each other by no more than 60 mils.

6. The stripline structure as recited in claim 1, wherein a separation distance between each first conductive vias and the conductive trace for all first conductive vias is equal to a separation distance between each second conductive vias and the conductive trace for all second conductive vias.

7. The stripline structure as recited in claim 1, wherein a separation distance between each first conductive via and any adjacent first conductive via is equal for all first conductive vias.

8. The stripline structure as recited in claim 1, wherein a separation distance between each second conductive via and any adjacent second conductive via is equal for all second conductive vias.

9. The stripline structure as recited in claim 1, wherein a separation distance between each first conductive vias and the conductive trace is equal for all first conductive vias.

10. The stripline structure as recited in claim 1, wherein a separation distance between each second conductive via and the conductive trace is equal for all second conductive vias.

11. The stripline structure as recited in claim 1 wherein a separation distance between each first conductive via and any adjacent first conductive via for all first conductive vias is equal to a separation distance between each second conductive via and any adjacent second conductive via for all second conductive vias.

* * * * *